(12) United States Patent
Tung (10) Patent No.: US 9,122,835 B2
(45) Date of Patent: Sep. 1, 2015

(54) METHOD FOR GENERATING LAYOUT OF PHOTOMASK

(71) Applicant: UNITED MICROELECTRONICS CORP., Hsin-Chu (TW)

(72) Inventor: Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/151,785

(22) Filed: Jan. 9, 2014

(65) Prior Publication Data

US 2015/0193573 A1    Jul. 9, 2015

(51) Int. Cl.
*G06F 17/50* (2006.01)

(52) U.S. Cl.
CPC ........ *G06F 17/5081* (2013.01); *G06F 17/5068* (2013.01); *G06F 2217/02* (2013.01); *G06F 2217/12* (2013.01)

(58) Field of Classification Search
USPC .......................................................... 716/55
See application file for complete search history.

(56) References Cited

U.S. PATENT DOCUMENTS

| 8,954,913 B1* | 2/2015 | Yuan et al. ..................... 716/126 |
| 2008/0069432 A1 | 3/2008 | Hsu |
| 2009/0181314 A1* | 7/2009 | Shyu et al. ........................ 430/5 |

OTHER PUBLICATIONS

Tung, Title of Invention: Layout Decomposition Method and Method for Manufacturing Semiconductor Device Applying the same, U.S. Appl. No. 13/676,185, filed Nov. 14, 2012.

* cited by examiner

*Primary Examiner* — Eric Lee
(74) *Attorney, Agent, or Firm* — Winston Hsu; Scott Margo (57) ABSTRACT

A method for generating a layout pattern of integrated circuit (IC) is provided. First, feature patterns are provided to a computer system and dummy pad patterns are generated in a space among the feature patterns. The layout pattern is then split into first feature patterns and second feature patterns. The dimensions of the first feature patterns are less than the dimensions of the second feature patterns. Afterwards, the dummy pad patterns are combined with the second features pattern to form a combined pattern. Then, mandrel patterns are generated in a space between the first feature patterns and the geometric patterns are generated according to the positions of the first feature patterns. Finally, the combined pattern, the mandrel patterns, and the geometric patterns are respectively outputted to form a first, a second, and a third photomasks.

20 Claims, 13 Drawing Sheets

METHOD FOR GENERATING LAYOUT OF PHOTOMASK

BACKGROUND OF THE INVENTION

1. Field of the Invention

The present invention generally relates to a method for generating layouts of photomasks, and more particularly to a method for generating layouts of photomasks by optical proximity correction (OPC).

2. Description of the Prior Art

Integrated circuits (IC) are made of devices and interconnections. In the fabrication process of ICs, photolithography is one of the essential techniques. The main purpose of the photolithography is to precisely transfer layouts on photomasks to a photoresist layer on a semiconductor substrate. Generally, by performing the photolithographic process as well as other semiconductor fabrication processes, such as etching processes, ion implantations, depositions and so forth, complicated and sophisticated IC structures can be obtained.

With the continuous miniaturization of semiconductor devices and the remarkable advance in fabrication techniques of semiconductor devices, the conventional lithography process meets its limitation due to printability and manufacturability problems. To meet the requirements of device design rules which continue to push the resolution limits of existing processes and tooling, a double patterning technique (DPT) has been developed and taken as one of the most promising lithography technologies for 32 nanometer (nm) node and 22 nm node patterning, since it can increase the half-pitch resolution up to twice higher by using current infrastructures. Besides, three-dimensional or non-planar transistor technology, such as the fin field effect transistor (FinFET) technology, has also been developed to replace planar MOS transistors. Generally, patterned structures in a FinFET, such as fin structures, can be obtained by sidewall image transfer (SIT).

Although the above-mentioned technologies, i.e. DPT and 3-D transistor technology, have been widely adopted by the semiconductor manufacturers and successively overcome major drawbacks in the fabrication processes, there are still some problems needing to be solved. For example, in order to prevent or overcome optical problems, such as optical proximity effect, in photolithography processes and polishing problems, such as dishing phenomenon, in planarization processes, dummy patterns are often added to layout patterns of semiconductor devices through computer simulation at the beginning of the fabrication process. However, how to effectively distribute different dummy patterns and feature patterns over individual photomasks is still a major topic for study in the semiconductor field. As such, improved methods for generating layouts of photomasks continue to be sought.

SUMMARY OF THE INVENTION

One object of the present invention is to provide a method for forming layouts of photomasks so as to solve the problems of the conventional techniques.

According to one embodiment of the present invention, a method for generating a layout pattern of an integrated circuit (IC) is provided and includes the following steps. First, feature patterns are provided to a computer system and dummy pad patterns are generated in a space among feature patterns. The layout pattern is then split into first feature patterns and second feature patterns. The dimensions of the first feature patterns are less than the dimensions of the second feature patterns. Afterwards, the dummy pad patterns are combined with the second feature patterns to form a combined pattern. Finally, the combined pattern is outputted to a photomask.

According to another embodiment of the present invention, a method for generating a layout pattern of integrated circuit (IC) is provided and includes the following steps. First, feature patterns are provided to a computer system and dummy pad patterns are generated in a space among the feature patterns. The layout pattern is then split into first feature patterns and second feature patterns. The dimensions of the first feature patterns are less than the dimensions of the second feature patterns. Afterwards, the dummy pad patterns are combined with the second features pattern to form a combined pattern. Then, mandrel patterns are generated in a space between the first feature patterns and the geometric patterns are generated according to the positions of the first feature patterns. Finally, the combined pattern, the mandrel patterns, and the geometric patterns are respectively outputted to form a first, a second, and a third photomasks.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the structures or apparatus are not to scale and some dimensions are exaggerated for clarity of presentation. Also, where multiple embodiments are disclosed and described as having some features in common, like or similar features will usually be described with same reference numerals for ease of illustration and description thereof.

FIG. 1 to FIG. 7 are schematic diagrams showing a method for forming layout patterns on photomasks according to one embodiment of the present invention. FIG. 8 is a simplified flowchart showing a method for forming layout patterns on photomasks according to one embodiment of the present invention. Please refer to FIG. 1 and FIG. 8. In step S110, an original layout pattern 1 is first provided to a database of a computer system. The original layout pattern 1, which is an ideal designed pattern supposed to be formed in final products, includes several feature patterns 10 used to construct integrated circuits (IC) such as device patterns, contact pad patterns, or layout of circuits, but not limited thereto. Depending on the type of IC, the design may also include logic cells, analog cells, memory cells, input/output (I/O) cells, but not limited thereto. Then, in step S120, the original layout pattern 1 is classified into at least first feature patterns 12 and second feature patterns 14 according to their minimum dimensions. For example, the dimensions of the first feature patterns 12 are at least less than one-fifth of the dimensions of the second feature patterns 14. The first feature patterns 12 may consist of straight line patterns 16 and bent line patterns 18 with the same widths, while the second feature patterns 14 may consist of rectangular pad patterns (not shown) connecting to the corresponding straight line patterns 16 or bent line patterns 18. Preferably, the first feature patterns 12 may be used to construct three-dimensional (3D) active regions in semiconductor devices, such as FinFET, and the second feature patterns 14 may be used to construct interconnection pads. In order to improve the electrical performance, the dimensions of the straight line patterns 16 and the bent line patterns 18 are smaller than those of the pad patterns, but not limited thereto.

Figure 1:
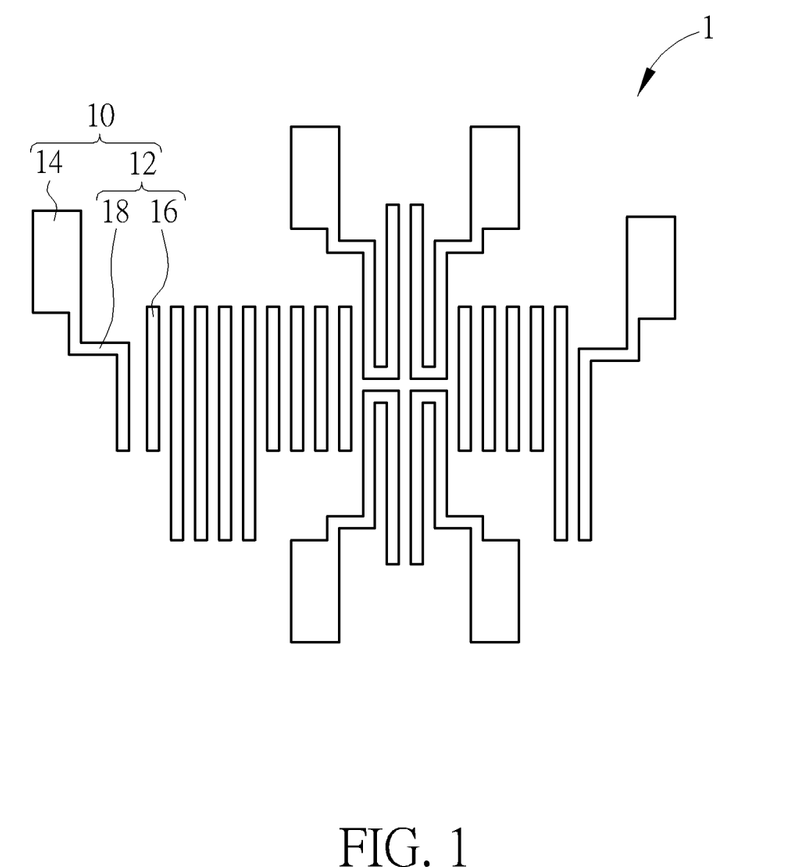
FIG. 1 to FIG. 7 are schematic diagrams showing a method for forming layout patterns on photomasks according to one embodiment of the present invention.
Figure 2:
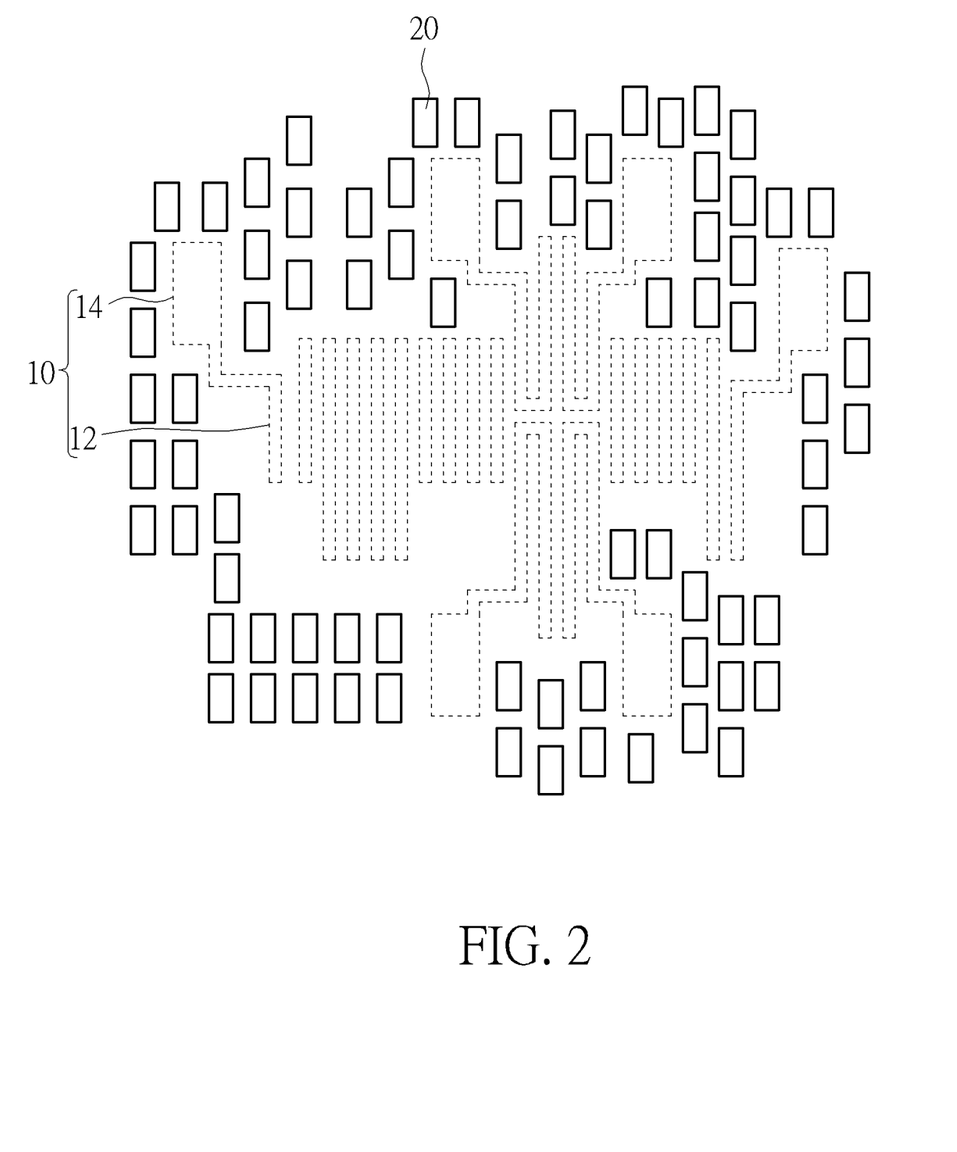

After the classification of the original layout pattern 1, dummy patterns are added in a space among the feature patterns in step S130. Referring to FIG. 2, after a simulation process in terms of the positions of the feature patterns 10, several dummy patterns 20 are generated and distributed in a space among the feature patterns 10 without overlapping them. In other words, the dummy pad patterns 20 are spaced apart from the feature patterns 10. The shapes of the dummy pad patterns 20 are rectangles, but not limited thereto; their shapes may also be squares, circles or ellipses. Preferably, all of the dummy patterns 20 are designed to have the same dimensions. According to one embodiment, all the dummy pad patterns 20 shown in FIG. 2 are printable. However, in another case, some of the dummy pad patterns may be non-printable so that they would not be transferred to a layer on or over a substrate in the following process. It should be noted that, since the dummy patterns 20 are well distributed around the feature patterns 10, some fabrication drawbacks occurring in the following polishing process may be prevented. For example, a dishing phenomenon caused by a CMP process for fabricating shallow trench isolation (STI) may be prevented.

Figure 3:
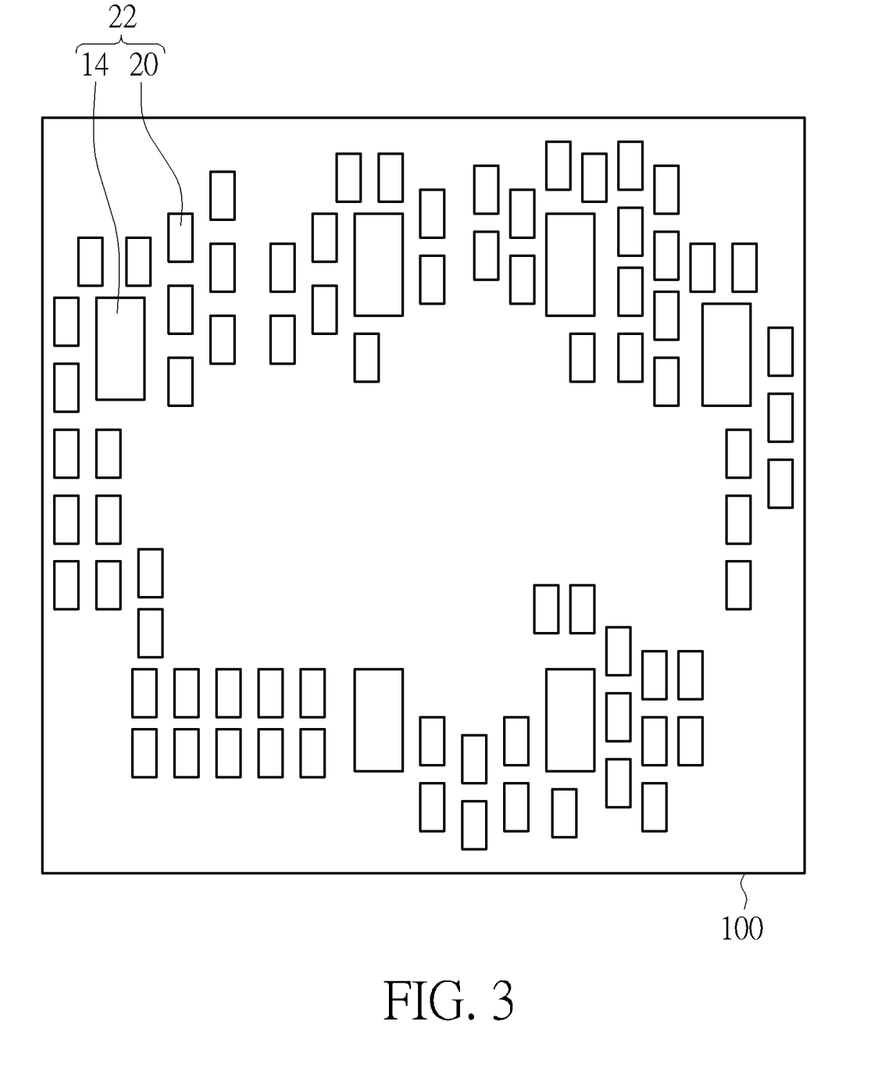

Then, referring to FIG. 3, the dummy pad patterns 20 are combined with the second feature patterns 14 in step 140 so as to generate a combined pattern 22. The combined pattern 22 may be optionally corrected through a correction process, such as an optical proximity correction (OPC) process, and then outputted to a photomask making unit to thereby form a first photomask 100 including the combined pattern 22. It should be noted that, since the combined pattern 22 may be optionally corrected by the OPC process, the second feature patterns 14, i.e. the pad patterns, and the dummy pad patterns 20 formed on the first photomask 100 may not be exactly the same as those later formed on the substrate and they may have slightly widened line ends and slightly inward and/or outward corners instead.

Figure 4:
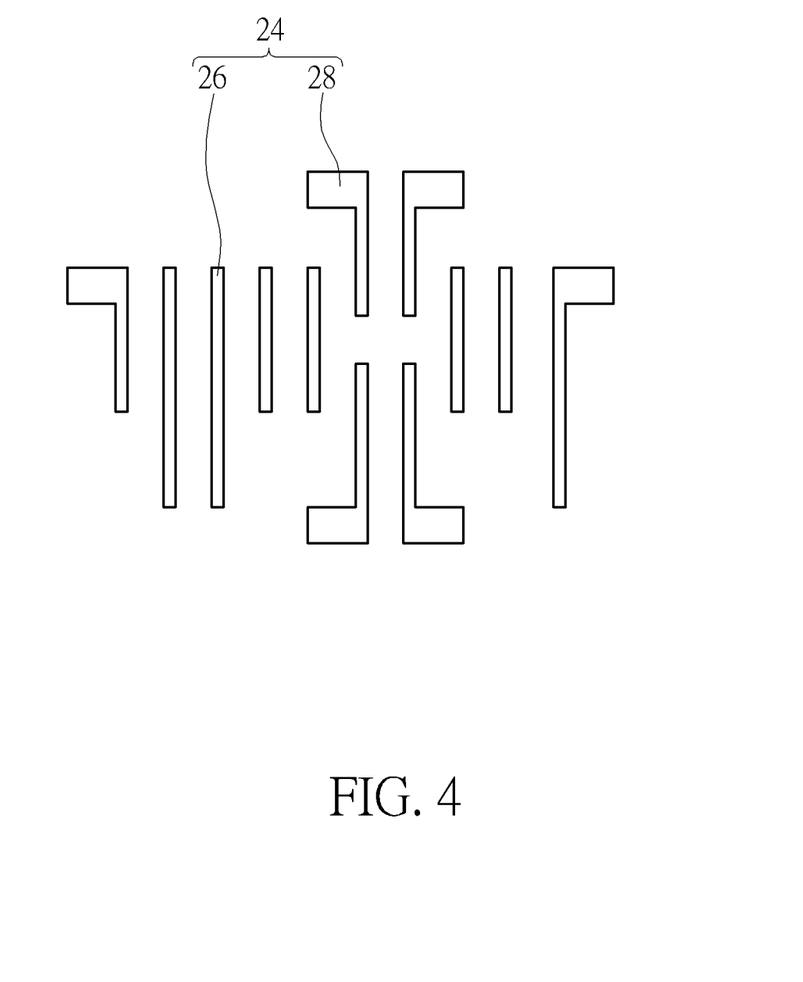
Figure 5:
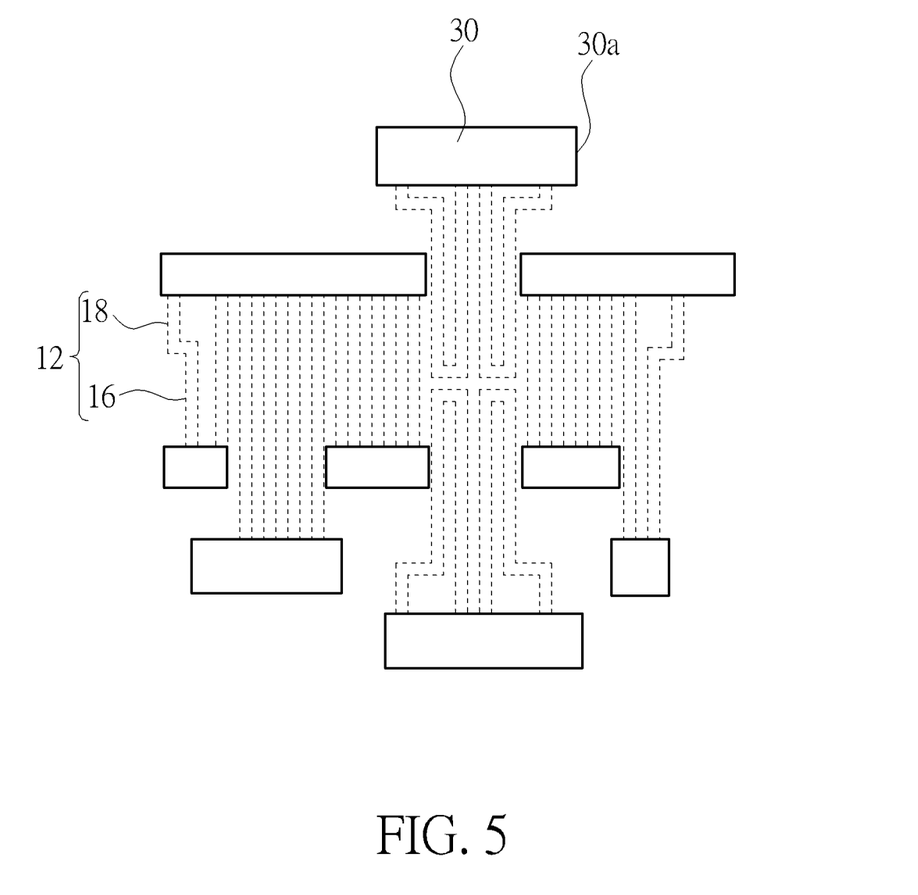

Since the dimensions of the first feature patterns are often less than the minimum resolution of exposure apparatuses, these first feature patterns may not be transferred to a substrate through single photolithographic process with i-line (365 nm wavelength) exposure light source. In other words, these first feature patterns need to be converted into at least two patterns, such as mandrel patterns and geometric patterns, which may be transferred to the substrate through at least two photolithographic processes, such as using an advanced 193 nm-ArF immersion tool with different exposure light sources with a combine mask. Please refer to FIG. 4 and FIG. 5. In step S150, the mandrel patterns and the geometric patterns are generated according to the positions of the first feature patterns. In detail, as depicted in FIG. 4, the mandrel patterns 24 consisting of straight line patterns 26 and L-shaped patterns 28 are generated. Since the mandrel patterns 24 are generated according to the positions of the first feature patterns shown in FIG. 1, the edges of the mandrel patterns 24 are preferably aligned with the edges of the first feature patterns. Preferably, the minimum dimensions of the mandrel patterns 24 are larger than those of the first feature patterns 12. Please refer to FIG. 5. The geometric patterns 30 are also generated according to the positions of the first feature patterns shown in FIG. 1. Preferably, the edges 30a of the geometric patterns 30 are also aligned with the edges of the first feature patterns. In this way, the positions of the geometric patterns 30 may overlap the positions of the mandrel patterns shown in FIG. 4. Preferably, the minimum dimensions of the geometric patterns 30 are larger than those of the first feature patterns.

Figure 6:
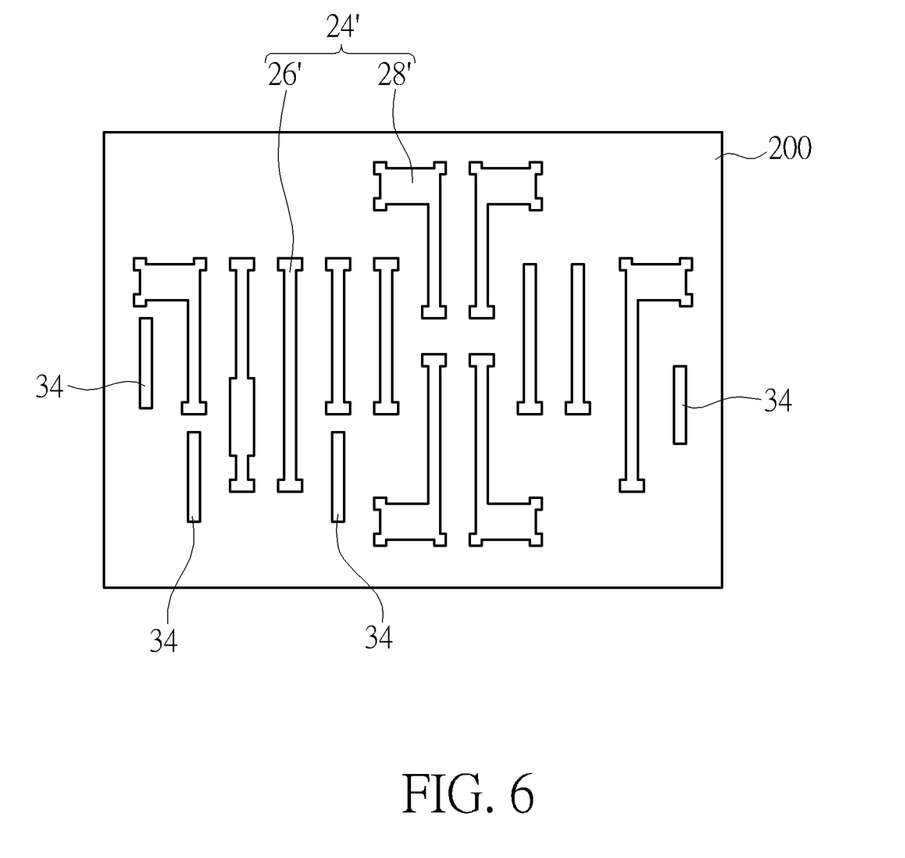
Figure 7:
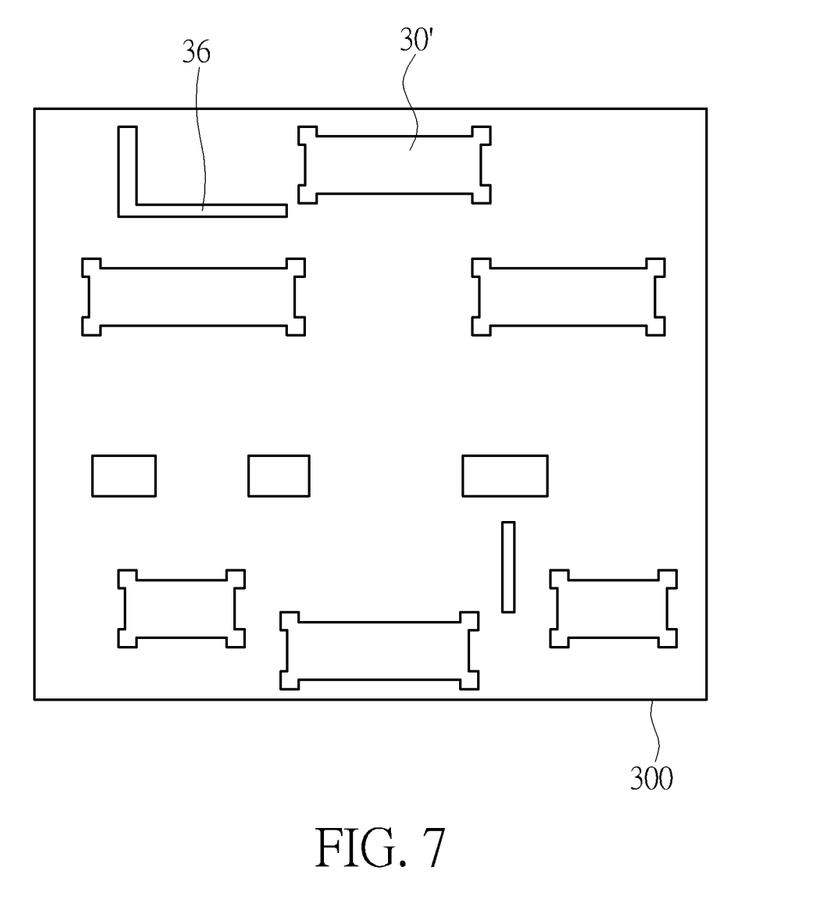
Figure 8:
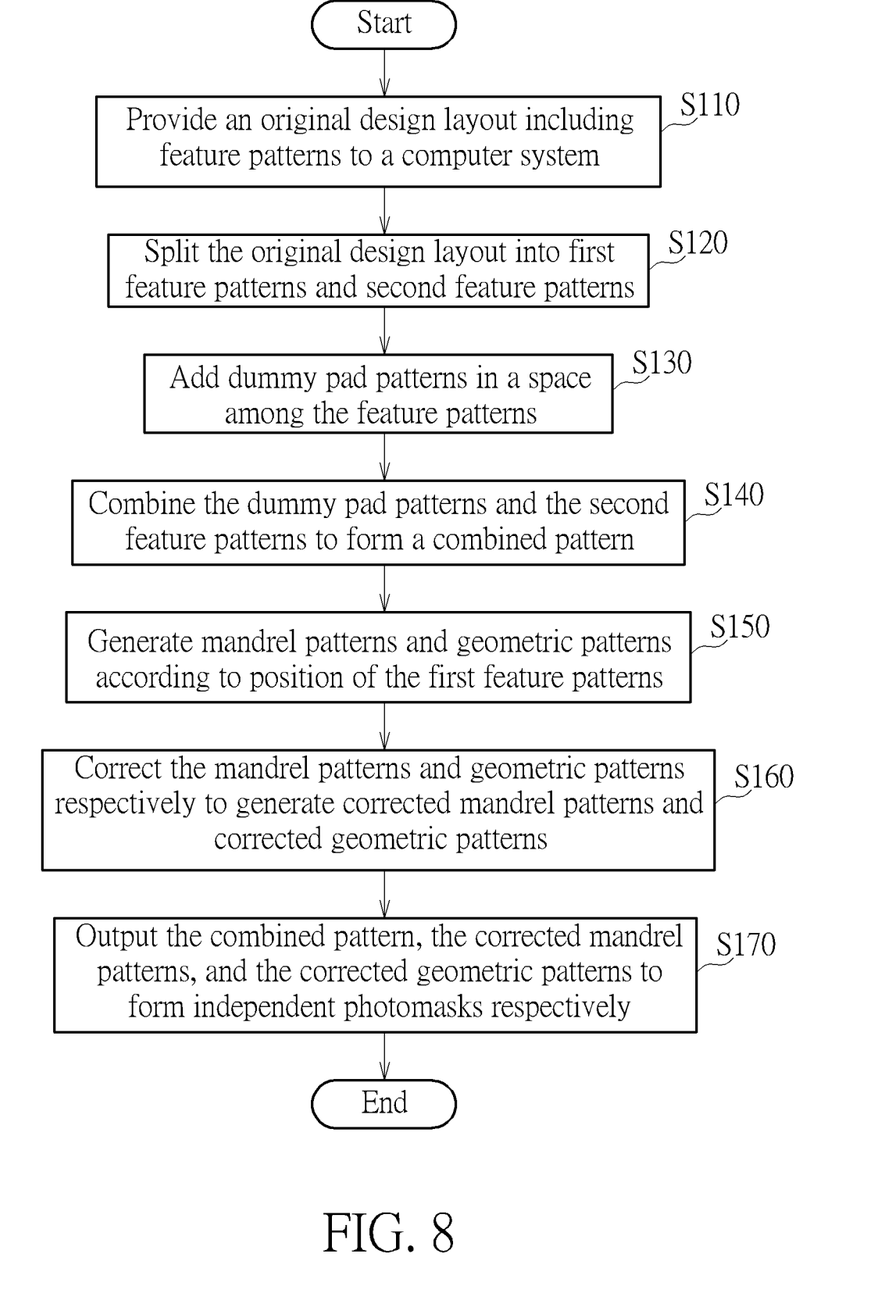
FIG. 8 is a simplified flowchart showing a method for forming layout patterns on photomasks according to one embodiment of the present invention.

Then, please refer to FIG. 6 and FIG. 7. In step S160, the mandrel patterns 24 and the geometric patterns 30, as respectively shown in FIG. 4 and FIG. 5, may be corrected respectively in order to overcome the influence of optical proximity effect on mandrel patterns and geometric patterns subsequently formed on the substrate. Preferably, this correction step is an optical proximity correction (OPC) process, but not limited thereto. For example, the usual way of correcting the layout patterns includes an adjustment of the line width of the line segment, and the disposition of printable or non-printable assist patterns, such as serif or hammerhead patterns at the line end or the corner. Preferably, the assist patterns on mandrel patterns and geometric patterns are non-printable. Alternatively, some of the assist patterns may be disposed apart from adjacent feature patterns. In this way, both the line width adjustment and the use of assist patterns may be successfully used to avoid the deviation of transferred patterns, such as rounded right-angle corners, shortened line-ends, or increased/decreased line widths.

In detail, referring to FIG. 6, corrected mandrel patterns 24' and assist patterns 34 are generated during step S160. In detail, the corrected mandrel patterns 24' include at least corrected straight line patterns 26' and corrected L-shaped patterns 28'. Since the corrected mandrel patterns 24' are corrected through the OPC process, the contours of the corrected mandrel patterns 24' may slightly differ from those of original mandrel patterns. For example, the corrected mandrel patterns 24' may have slightly widened line ends and slightly inward and/or outward corners instead. After the formation of the corrected mandrel patterns 24', these patterns may be outputted to the photomask making unit to thereby form a second photomask 200 in step S170. Similarly, referring to FIG. 7, corrected geometric patterns 30' and assist patterns 36 are also generated during step S160. Since the corrected geometric patterns 30' are corrected through the OPC process, the contours of the corrected geometric patterns 30' may also slightly differ from those of original geometric patterns 30. For example, the corrected geometric patterns 30' may have slightly widened line ends and slightly inward and/or outward corners instead. After the formation of the corrected geometric patterns 30', these patterns may also be outputted to the photomask making unit to thereby form a third photomask 300 in step S170.

In the above paragraphs, methods for generating pad patterns, the corrected mandrel patterns, and the corrected geometric patterns are illustrated. These patterns may be respectively outputted to the photomask making unit so as to fabricate the corresponding photomasks. In the following paragraphs, the method for transferring these patterns from the photomasks to layers over a substrate is further described in detail for the sake of clarity.

Figure 9:
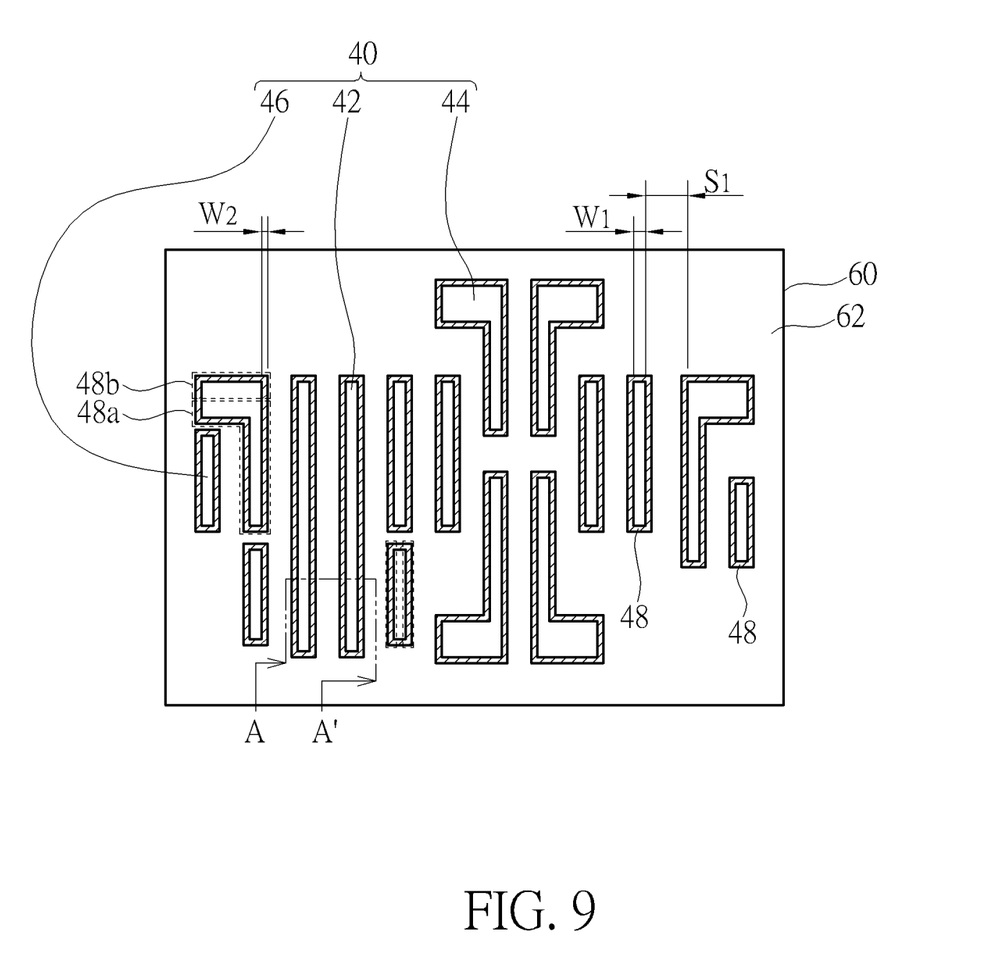
FIG. 9 to FIG. 13 are schematic diagrams showing a method for forming a layout pattern on a substrate according to one embodiment of the present invention.
Figure 10:
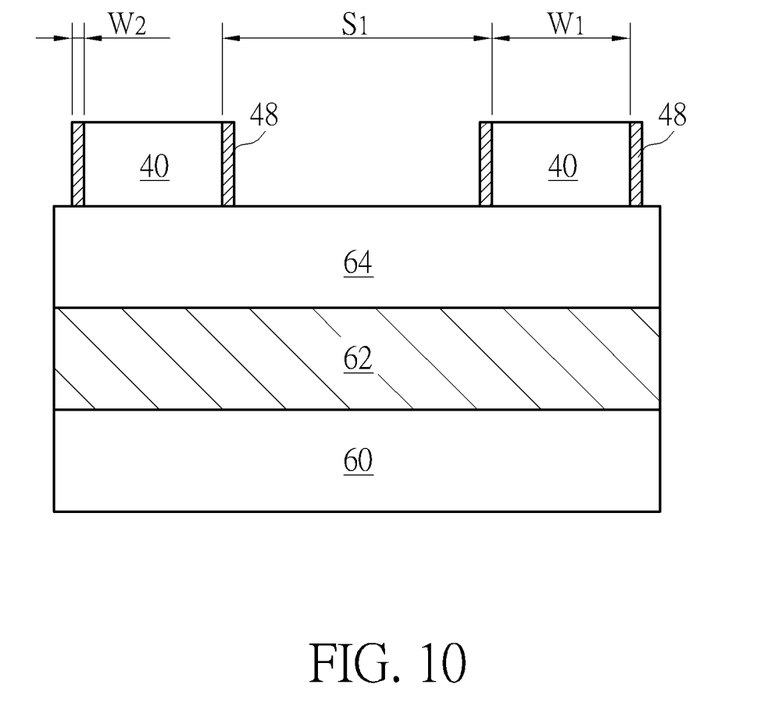

Please refer to FIG. 9 and FIG. 10. FIG. 9 is a schematic diagram showing mandrel patterns transferred to a layer over a substrate and surrounded by spacers. FIG. 10 is schematic cross-sectional diagram taken along a line A-A' in FIG. 9. Referring to FIG. 9 and FIG. 10, the patterns of the second photomask 200 as shown in FIG. 6 are transferred to a layer over a substrate 30. For example, for a case where the substrate 60 is covered by multiple layers, such as a target layer 62, a hard mask layer 64, and a sacrificial layer (not shown), the patterns of the second photomask may be transferred to the sacrificial layer through a suitable photolithographic process and an etching process so as to form a first patterned layer 38. It should be noted that the first patterned layer 40 has a layout similar to the layout of the second photomask. That is to say, the first patterned layer 40 also includes the straight line patterns 42, the L-shaped patterns 44, and the assist patterns 46.

The above-mentioned substrate 60 may be a semiconductor substrate (such as a silicon substrate), a silicon containing substrate (such as a silicon carbide substrate), a III-V group-on-silicon (such as GaN-on-silicon) substrate, a graphene-on-silicon substrate, a silicon-on-insulator (SOI) substrate or an epitaxial layer containing substrate. The target layer 62 may be a semiconductor layer made of materials the same as or different from that of the underlying substrate 30. The hard mask layer 64 is made of a dielectric layer, such as silicon oxide layer or a silicon nitride layer, but not limited thereto. The sacrificial layer may be made of silicon material, III-V group semiconductors or other suitable semiconductor materials, and preferably be made of polysilicon material. Besides, there may be another layer, such as a pad layer or another hard mask layer, disposed on or under the hard mask layer 64, but not limited thereto.

Please refer back to FIG. 9. After the formation of the first patterned layer 40, spacers (not shown) are formed on the sidewalls of the first patterned layer 40 through a deposition and an etching processes. In this way, loop-shaped patterns 48 are formed on the sidewalls of the straight line patterns 42, the L-shaped patterns 44, and the assist patterns 46. Precisely, each of the loop-shaped patterns 48 may be further divided into two portions, such as major portions 48a and redundancy portions 48b. The layout of the major portions 48a may be used to define fin structures and the redundancy portions 48b may be removed in the following etching process. In detail, the first patterned layer 40 may be distributed with suitable spacings in order to meet the requirements of the minimum rule according to corresponding photolithographic process. Preferably, the spacings S1 between two adjacent straight line patterns 42 and/or L-shaped patterns 44 are larger than or equal to the minimum design rule. Besides, the critical dimension of the loop-shaped patterns 48 is less than the critical dimensions of the patterns 42 and 44. In other words, the widths W1 of the straight line patterns 42 and/or L-shaped patterns 44 are preferably wider than the widths W2 of the loop-shaped patterns 48.

Figure 11:
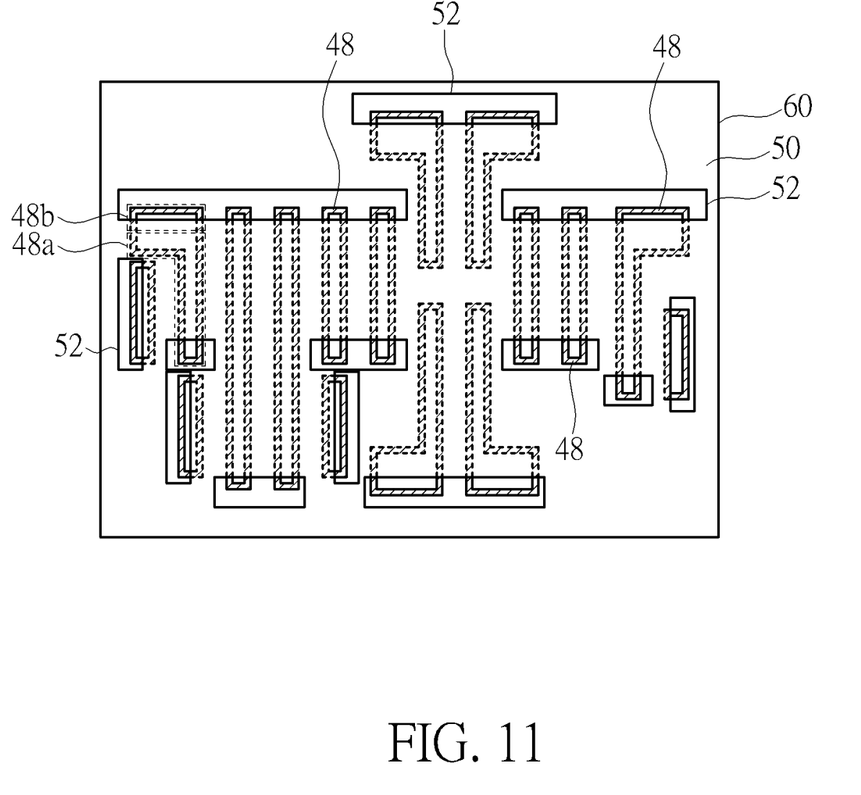

After the formation of the loop-shaped patterns 48, all or portions of the first patterned layer 33 may be removed optionally through suitable etching processes. Then, please refer to FIG. 11. FIG. 11 is a schematic diagram showing a structure after transferring geometric patterns and forming a second patterned layer covering loop-shaped patterns. Referring to FIG. 11, the geometric patterns of the third photomask 300 in FIG. 7 are transferred to a layer over the substrate 60 so as to form the structure shown in FIG. 11. For example, during the transferring process, a photoresist layer (not shown) may be first coated on the loop-shaped patterns 48. Then, the geometric patterns may be transferred to the photoresist layer. In this way, a second patterned layer, such as a patterned photoresist layer 50 with openings 52 from which portions of the loop-shaped patterns 48 are exposed may be formed. It should be noted that the positions of the openings 52 correspond to those of the geometric patterns of the third photomask 300 in FIG. 7. Besides, since the positions of the openings 52 correspond to those of the redundancy portion 48b of the loop-shaped patterns 48, the redundancy portions 48b of the loop-shaped patterns 48 are removed in the subsequent etching process.

Figure 12:
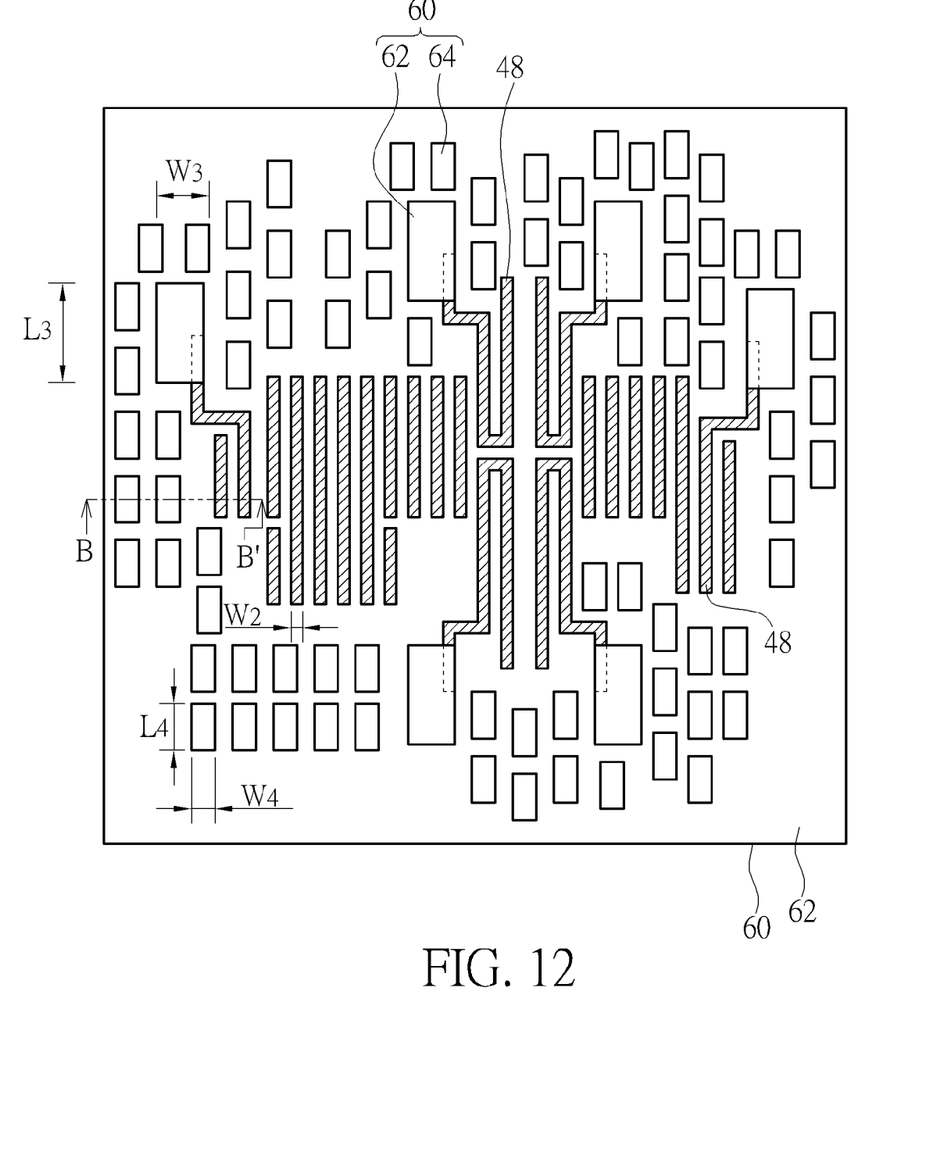

After the formation of the patterned photoresist layer 50, the redundancy portion 48b of the loop-shaped patterns 48 exposed form the openings 52 may be further removed so as to leave the main portions 48a of the loop-shaped patterns 48. Then, the patterned photoresist layer 50 may be removed. Afterwards, the second feature patterns and the dummy pad patterns in the first photomask shown in FIG. 3 may be further transferred to a layer over the substrate. Referring to FIG. 12, for example, another photoresist layer (not shown) may be first coated on the hard mask layer 64. Then, the second feature patterns and the dummy pad patterns may be transferred to the photoresist layer. In this way, a third patterned layer, such as a patterned photoresist layer 60 including second feature patterns, such as pad patterns 62, and dummy pad patterns 64 may be formed. It should be noted that portions of the main portions 48a of the loop-shaped patterns 48 may be covered by the pad patterns 62. In addition, the shapes of the pad patterns 62 and the dummy pad patterns 64 are rectangles, but not limited thereto; their shapes may also be squares, circles or ellipses. Preferably, the dimensions of the pad patterns 62 are larger than those of the dummy pad patterns 64. More preferably, the dimensions of the dummy pad patterns 64 are larger than those of the main portions 48a of the loop-shaped patterns 48. According to this embodiment, the dummy pad patterns 64 may be uniformly distributed around a periphery of major portions 48a of the loop-shaped feature patterns. That is to say, the dummy pad patterns 64 do not cover or overlay any major portion 48a. In addition, the third patterned layer 60 preferably has a critical dimension greater than that of the first and the second patterned layers 40 and 50. That is to say, the widths W3 and W4 of the third patterned layer 60 are wider than the widths W1 and W2 of the first and the second patterned layer 40 and 50. Furthermore, the lengths L3 of the pad patterns 62 may be longer than the lengths L4 of the dummy pad patterns 64.

Figure 13:
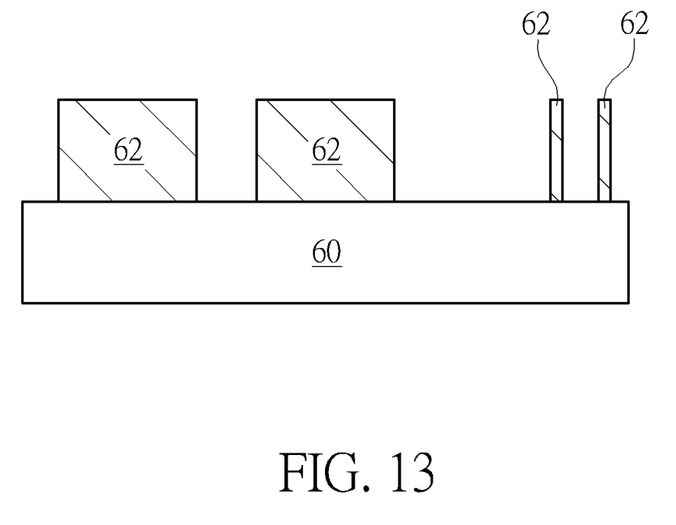

Please refer to FIG. 13 which is a schematic diagram taken along a line B-B' in FIG. 12. In the following process, referring to FIG. 13, at least a suitable etching process, such as an anisotropic etching process, may be carried out by using both the major portions 48a of the loop-shaped patterns 48 as and the third patterned layer 60 an etch mask. In this way, a layout pattern consisting of the major portions 48a and the third patterned layer 60 may be further transferred to the target layer 62 so as to form patterned target layer (not shown). According to this embodiment, the layout of the patterned target layer corresponding to the original layout provided to the database of the computer system may be obtained.

To summarize, the embodiments of the present invention provide methods for generating layouts of photomasks. The mandrel patterns, the geometric patterns, and the combined patterns may be transferred to the target layer through three lithographic processes and three etching processes. More precisely, the combined pattern and the main portions of the loop-shaped patterns may be concurrently transferred to the target layer by the last etching process. Since the mandrel patterns, the geometric patterns, and the combined patterns used to construct the IC layout are distributed in different photomasks, the original layout may be formed in the target layer more effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for generating a layout pattern of an integrated circuit (IC), comprising:
   providing a plurality of feature patterns to a computer system;
   generating a plurality of dummy pad patterns in a space among feature patterns by the computer system;
   splitting the feature patterns into a plurality of first feature patterns and a plurality of second feature patterns by the computer system, wherein dimensions of the first feature patterns are less than dimensions of the second feature patterns;
   combining the dummy pad patterns with the second feature patterns by the computer system so as to form a combined pattern; and
   fabricating the combined pattern on a photomask substrate so as to form a photomask.

2. The method of claim 1, wherein the dummy pad patterns are spaced apart from the feature patterns.

3. The method of claim 1, wherein the first feature patterns are line patterns and the second feature patterns are pad patterns.

4. The method of claim 3, wherein the first feature patterns and the second feature patterns are printed by different light source.

5. The method of claim 1, wherein the dimensions of the first feature patterns are at least less than one-fifth (1/5) of the dimensions of the second feature patterns.

6. The method of claim 1, further comprising:
   generating a plurality of mandrel patterns and geometric patterns according to the positions of the first feature patterns;
   correcting shapes of the mandrel patterns and the geometric patterns to respectively generate a plurality of corrected mandrel patterns and a plurality of corrected geometric patterns; and
   outputting the corrected mandrel patterns and the corrected geometric patterns to respective photomasks.

7. The method of claim 6, wherein the mandrel patterns include assist patterns after the step of correcting the shapes of the mandrel patterns.

8. The method of claim 7, wherein the assist patterns are non-printable.

9. The method of claim 6, wherein positions of the mandrel patterns partially overlap positions of the geometric patterns.

10. The method of claim 6, wherein the step of correcting the shapes of the mandrel patterns and geometric patterns is an optical proximity correction (OPC) process.

11. The method of claim 6, wherein the combined pattern, the corrected mandrel patterns and the corrected geometric patterns are respectively outputted to independent photomasks.

12. The method of claim 6, further comprising:
   transferring the mandrel patterns to a layer over a substrate so as to form a first patterned layer;
   forming spacers on sidewalls of the first patterned layer so as to constitute loop-shaped patterns;
   transferring the geometric patterns to form a second patterned layer covering portions of the loop-shaped patterns so that other portions of the loop-shaped patterns are exposed from the second patterned layer;
   removing the loop-shaped patterns exposed from the second patterned layer; and
   forming a plurality of pad patterns covering the loop-shaped patterns.

13. The method of claim 12, further comprising transferring a layout consisting of the second patterned layer and the pad patterns to a target layer on the substrate.

14. The method of claim 12, wherein the step of forming the pad patterns is performed after the step of removing the loop-shaped patterns.

15. A method for generating a layout pattern of an integrated circuit (IC) comprising a FinFET structure layout, comprising:
   providing a plurality of feature patterns to a computer system;
   generating a plurality of dummy pad patterns in a space among the feature patterns;
   splitting the feature patterns into a plurality of first feature patterns and a plurality of second feature patterns, wherein dimensions of the first feature patterns are less than dimensions of the second feature patterns;
   combining the dummy pad patterns with the second features pattern to form a combined pattern;
   generating a plurality of mandrel patterns in a space between the first feature patterns;
   generating a plurality of geometric patterns according to positions of the first feature patterns;
   fabricating the combined pattern on a photomask substrate so as to form a first photomask;
   fabricating the mandrel patterns on another photomask substrate so as to form a second photomask; and
   fabricating the geometric patterns on still another photomask substrate so as to form a third photomask.

16. The method of claim 15, further comprising generating a plurality of assist patterns in a space among the mandrel patterns or the geometric patterns.

17. The method of claim 16, wherein the assist patterns among the mandrel patterns or the geometric patterns are non-printable.

18. The method of claim 15, wherein edges of the mandrel patterns are aligned with edges of the first feature patterns.

19. The method of claim 15, wherein the geometric patterns overlap portions of the mandrel patterns.

20. The method of claim 15, further comprising correcting the mandrel patterns and the geometric patterns by an optical proximity correction (OPC) process.

* * * * *